United States Patent [19]

Kamiya et al.

[11] Patent Number: 4,666,734
[45] Date of Patent: May 19, 1987

[54] APPARATUS AND PROCESS FOR MASS PRODUCTION OF FILM BY VACUUM DEPOSITION

[75] Inventors: Osamu Kamiya, Machida; Keijiro Nishida, Kanagawa; Yasutomo Fujiyama, Yokohama; Kyosuke Ogawa, Sakorashimachi, all of Japan

[73] Assignee: Canon Kabushiki Kaisha, Tokyo, Japan

[21] Appl. No.: 491,799

[22] Filed: May 5, 1983

[30] Foreign Application Priority Data

May 13, 1982 [JP] Japan .................... 57-81261

[51] Int. Cl.⁴ ............................................ B05D 3/06
[52] U.S. Cl. ............................... 427/39; 118/50.1; 118/719; 118/729; 422/186.29
[58] Field of Search ............ 118/50.1, 620, 723, 118/729, 719; 422/186.04, 186.29; 427/38, 39

[56] References Cited

U.S. PATENT DOCUMENTS

| | | | |
|---|---|---|---|
| 3,086,882 | 4/1963 | Smith et al. | 427/163 |
| 3,404,661 | 10/1968 | Mathias et al. | 118/49 |
| 3,568,632 | 3/1971 | Cawthon | 118/719 |
| 3,856,654 | 12/1974 | George | 204/298 |
| 3,915,117 | 10/1975 | Schertler | 118/719 |
| 4,226,208 | 10/1980 | Nishida et al. | 118/50.1 |

FOREIGN PATENT DOCUMENTS 0011160 5/1980 European Pat. Off. .
2420430 11/1974 Fed. Rep. of Germany .
2165849 8/1973 France .

OTHER PUBLICATIONS

IBM Tech. Disc. Bull., vol. 11, No. 7, Dec. 1968, pp. 757, 758.
IBM Tech. Disc. Bull., vol. 18, No. 5, Oct. 1975, pp. 1504, 1505.

*Primary Examiner*—John H. Newsome
*Attorney, Agent, or Firm*—Fitzpatrick, Cella, Harper & Scinto

[57] ABSTRACT

An apparatus and a process for mass production of films by vacuum deposition comprise a substrate charging stage which is evacuated, an interconnecting stage which is positioned adjacent to said substrate charging stage and is evacuated, and a film forming stage which is removably attached to the interconnecting stage and is evacuated independently of the interconnecting stage.

23 Claims, 5 Drawing Figures

APPARATUS AND PROCESS FOR MASS PRODUCTION OF FILM BY VACUUM DEPOSITION

BACKGROUND OF THE INVENTION

This invention relates to an apparatus and a process for mass production of films by vacuum deposition.

There is the plasma CVD (chemical vapor deposition) process which appears before the footlights in recent years as a technique for producing a thin film. This process comprises evacuating a reaction chamber to a high vacuum, feeding a raw material gas into the chamber, then decomposing the gas by glow discharge, thereby forming a thin film on a substrate placed in the chamber. For instance, this process is applied to the production of amorphous silicon films. The amorphous silicon film prepared from a silane such as $SiH_4$, $Si_2H_6$ and the like by this process has relatively few localized levels in the forbidden band, its valence electron control is possible by doping it with a replacement type of impurity, and it can be produced to have excellent characteristics as an electrophotographic photosensitive member, so that much is expected therefrom.

The electrophotographic photosensitive member generally comprises a photoconductive layer and its substrate of so-called drum type. It is known that a batch type plasma CVD apparatus composed of a single vacuum chamber is employed for making such drum type photosensitive members.

This batch type plasma CVD apparatus has a structure, for example, as shown in FIG. 1. That is, the apparatus is constructed of a vacuum chamber 10 having a cover 1 and containing a cylindrical electrode 2 to which a high frequency voltage is to be applied and a drum type substrate 3 as an earthed counter electrode. The drum type substrate 3 on which a photoconductive film is to be formed can be heated with an internal heater 4; 5 is a rotary axis for revolving the substrate 3; 6 is a cylindrical shield for confining a plasma in a prescribed space inside the vacuum chamber; 9 is an evacuating system for the vacuum chamber 10; and 8 is a gas feeding system for introducing a feed gas into the vacuum chamber.

A plasma CVD film, e.g. an amorphous silicon film, is formed on the drum type substrate 3 by using such an apparatus in the following way:

The cover 1 is opened, a drum type substrate 3 is fixed around the rotary axis 5, the cover 1 is closed, and the vacuum chamber 10 is evacuated by the evacuating system 9 to a desired vacuum pressure. At the same time the drum type substrate 3 is heated to a temperature, for example, between about 200° and about 300° C. After the temperature has settled, a raw material gas is introduced from the gas-feeding system 8 into the vacuum chamber 10. The inside of the vacuum chamber is kept at a suitable pressure by controlling the feed gas flow and the sucked gas flow, and a high frequency voltage is applied to cylindrical electrode to cause a plasma in the space surrounded by the cylindrical shield 6. The feed gas, e.g. a silane, is decomposed and amorphous silicon deposits on the surface of the drum type substrate 3. After the deposit has grown to a desired thickness, the electric discharge and the introduction of gas are stopped and the heater 4 is switched off to leave the film-covered substrate 3 to cool.

Thereafter, air is introduced into the vacuum chamber 10, the cover 1 is opened, and the drum type substrate 3 on which a film is deposited is taken out.

In this film forming process, the initial evacuation and heating steps usually require 30 minutes-1 hour, the film forming step requires about 3 hours on the assumption that the film growing rate is about 10 Å/sec and the thickness of completed film is 10 μm, and the cooling step requires for about 1-2 hours. Thus, the total time requirement at maximum is as much as about 6 hours, indicating poor productivity.

On the other hand, when an amorphous silicon film is formed by the plasma CVD process, a byproduct called polysilane is produced, which is in a fine powder form. In addition, when a thick film as much as about 10 μm or more is formed, films form also on the cylindrical shield 6 and the cylindrical electrode 2. When the film forming process is repeated several times, these films will peel off and their fine fragments will scatter in the vacuum chamber 10. The polysilane powder and the fine fragments are blown up by the air flow at the introduction of air into the vacuum chamber 10 or at the evacuation of the chamber 10 after setting of the drum type substrate 3 thereinto, thus contaminating the surface of the substrate 3 and causing a deterioration of product quality.

Thus, according to the prior art, the disassembly and cleaning of the vacuum chamber is necessary after every film formation in order to minimize these effects of the powders.

SUMMARY OF THE INVENTION

The primary object of this invention is to provide an apparatus and process for mass production of films by vacuum deposition, said apparatus and process permitting continuous steady production of high quality large area films by vacuum deposition at a high production rate without suffering the above noted difficulties of the prior art.

Thus, this invention provides an apparatus for mass production of films by vacuum deposition which comprises a substrate charging chamber which can be evacuated; an interconnecting chamber which is positioned adjacent to said substrate charging chamber and can be evacuated, and a film forming chamber which is removably attached to the lower side of the interconnecting chamber and can be evacuated independently of the interconnecting chamber.

This invention also provide a process for mass production of films by vacuum deposition which comprises the steps of:

(1) setting a substrate for film supporting, in a substrate charging stage which may be evacuated, (2) evacuating thereafter said substrate charging stage to a desired pressure, (3) transferring the substrate from the substrate charging stage to an interconnecting stage evacuated in advance to a desired pressure, (4) transferring said substrate from the interconnecting stage to a reaction chamber which is positioned under the interconnecting stage and evacuated in advance to a desired pressure, and setting the substrate in the reaction chamber, (5) introducing thereafter a film forming raw material gas into the reaction chamber, and keeping the reaction chamber at a desired pressure, (6) forming a plasma environment of the introduced raw material gas in the reaction chamber by an electric discharge, to deposit a film on the substrate, (7) returning the completed-film supporting substrate to the interconnecting stage, and (8) cooling and taking out the completed-film supporting substrate.

DESCRIPTION OF PREFERRED EMBODIMENTS

Figure 1:
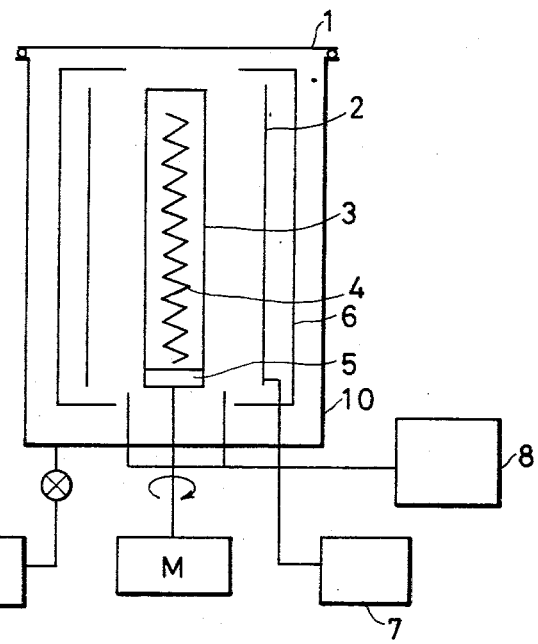
FIG. 1 is a diagrammatic illustration of a prior art apparatus for producing films by vacuum deposition.

Referring now to the drawings, this invention is described in detail.

Figure 2:
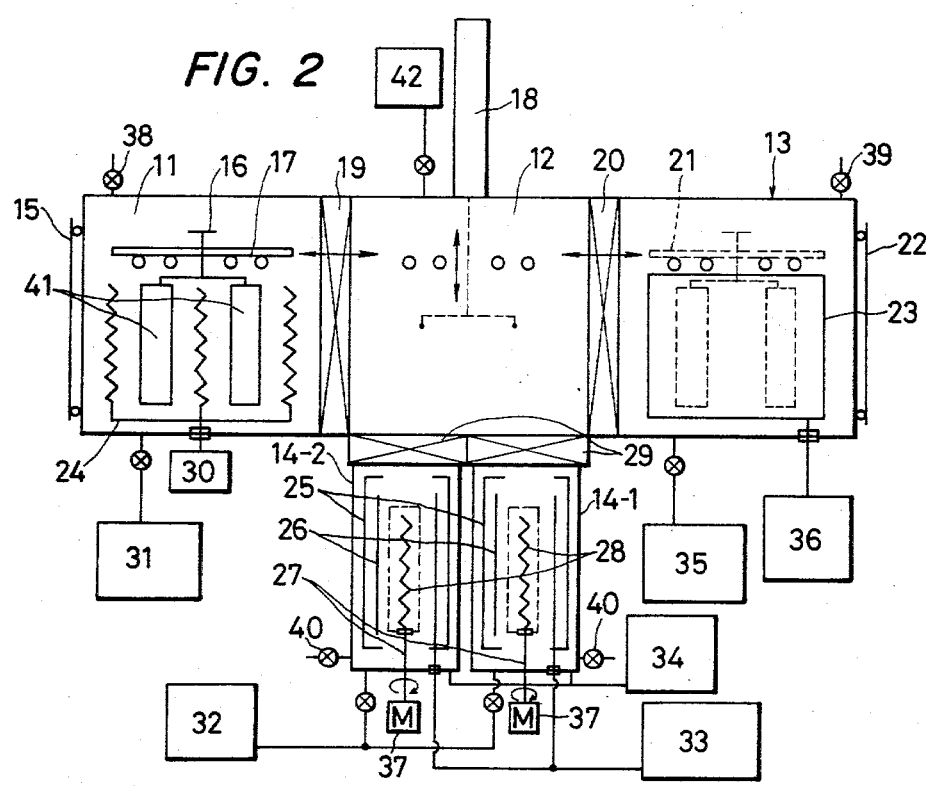
FIGS. 2-5 are diagrammatic illustrations of preferred embodiments of the apparatus of this invention for producing films by vacuum deposition.

FIG. 2 shows the basic construction of the principal sections of a preferred embodiment of the apparatus for mass production of films by vacuum deposition. In the first place, the process of this invention for forming a film on a drum type substrate is illustrated with reference to FIG. 2.

Herein, 11 is a substrate charging chamber (a substrate charging stage) for setting one or more drum type substrates 41 on prescribed positions, where a door 15 is opened and one or more drum type substrates are fastened to a fixing means 16.

Then, the door 15 is closed, the substrate charging chamber 11 is evacuated to a desired vacuum, and the drum type substrates 41 are simultaneously heated desirably at 50°-450° C., preferably at 50°-400° C., and most suitably at 200°-300° C. with a heater 24. After sufficient stabilization of the substrate temperature, an intermediate gate valve 19 is opened and the drum type substrates 41 are transferred by a transporting means 17 into an interconnecting chamber (interconnecting stage) 12 kept at a desired vacuum pressure by means of an evacuating system 42. Then, the gate valve 19 is closed, the same number of gate valves 29 as the number of substrates 41 are opened, and the substrates 41 are transferred down by a vertically moving means 18 into a plurality of reaction chambers 14-1 and 14-2 (film forming stages) attached to the interconnecting stage 12 to face the gate valves 29, respectively.

The drum type substrates 41 are placed separately on substrate fixing means rotatable with driving units 37, and the vertically moving means 18 is returned to the starting position.

After closure of gate valves 29, a raw material film-forming gas such as a silane is introduced through a raw material gas-feeding system 34 and the insides of the reaction chambers 14-1 and 14-2 are adjusted to a suitable reduced pressure by regulating an evacuating system 32 and the gas feeding system 34. Then, a high-frequency voltage is applied to electrodes 26 from a high-frequency power source 33 to generate an electric discharge in each reaction chamber 14-1 and 14-2. The introduced raw material gas such as a silane is decomposed by the electric discharge, and amorphous silicon is deposited on the drum type substrates 41 to form films. During this, the substrates 41 are heated by applying heat from the inside of the substrates with heaters 28 and are revolved by means of the driving units 37 for the purpose of making uniform the film thickness. The plasma environments caused by the electric discharge are confined in the limited spaces in reaction chambers 14-1 and 14-2, respectively, by the action of electrical shields 25.

After completion of the film formation, the introduction of the raw material gas is stopped and at the same time the high-frequency power source 33 is switched off. Then, the gate valves 29 are opened, the film-covered drum type substrates 41 are drawn up into the interconnecting stage 12 by means the vertically movable carrier 18, and the gate valves 29 are closed. Then, a gate valve 20 is opened, the film-covered substrates 41 are transferred by a transporting means 21 into a discharging chamber (a chamber through which the finished substrates are taken out) 13 evacuated in advance to a prescribed pressure, and the gate valve 20 is closed again. The substrates 41 transferred into the discharge chamber 13 are cooled through cooling plates 23 by means of a cooler 36 to a prescribed temperature under a prescribed reduced pressure. Then, a leak valve 39 is gradually opened so as not to exert any adverse effect on the formed films, the discharge chamber 13 is allowed to communicate with the air, a discharge door 22 is opened, the film-covered substrates 41 are taken out.

For the purpose of smooth operation of the continuous production process, the discharge chamber 13 is desirably evacuated quickly to a desired vacuum pressure after the substrates have been taken out. In the apparatus shown in FIG. 2, the reaction chambers 14-1 and 14-2 are designed so that they can be disengaged separately for cleaning from the body at the lower sides of the gate valves 29, after completion of the film formation and air is introduced thereinto by opening their respective leak valves 40.

It is possible by repeating the above stated operations to accomplish continuous production of films vacuum-deposited on a number of drum type substrates.

In this invention, one or more film-forming reaction chambers are employed. In particular, with a number of reaction chambers, films can be formed on many drum type substrates at the same time and additionally different kinds of films or multilayered films each consisting of different materials can also be formed parallel on individual substrates by providing the reaction chambers with different raw material gas-feeding systems, high-frequency power sources, and evacuating systems.

When a plurality of reaction chambers are employed, high operation rates can be achieved even if some of the reaction chambers get out of order, since the remaining normal reaction chambers can be operated to continue the production.

Moreover, if a spare reaction chamber is provided, the reaction chamber to be cleaned can be exchanged with the spare reaction chamber previously cleaned, since the reaction chambers are removably attached to the interconnecting stage, whereby the operation rate of the apparatus can be further improved.

Figure 3:
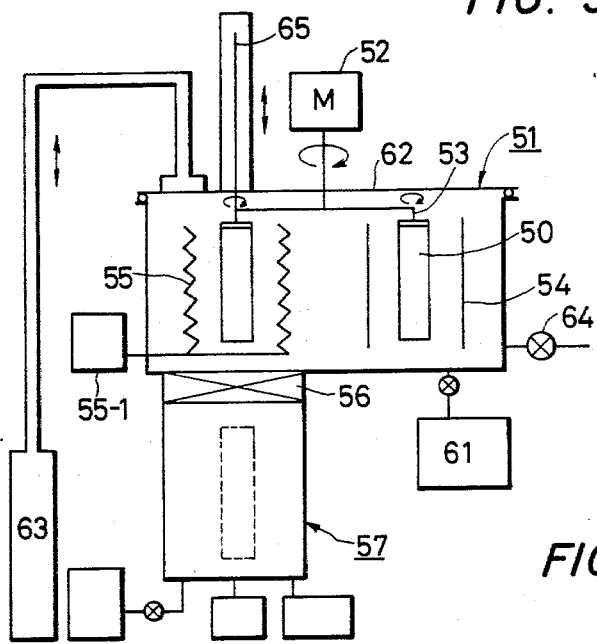
Figure 4:
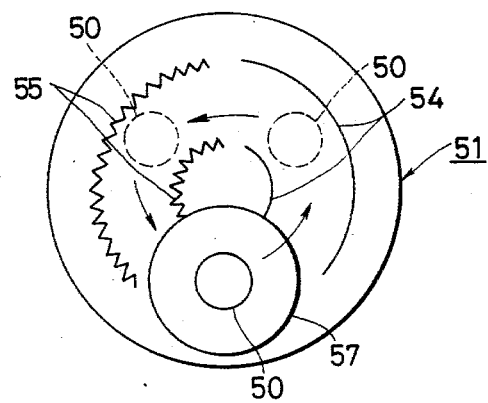

Another preferred embodiment of the apparatus of this invention is shown in FIGS. 3 and 4.

In the apparatus shown in FIG. 3, the substrate charging stage 11, interconnecting stage 12, and discharging chamber 13 of the apparatus shown in FIG. 2 are united into a single vacuum chamber 51 as shown in FIG. 3 (a diagrammatic plan view of the vacuum chamber 51 seen from the upper side is shown in FIG. 4), and a drum type substrate 50 is attached to a rotatable fixing means 53 after the cover 62 of the vacuum chamber 51 has been raised by a vertically moving means 63. Thereafter the cover 62 is lowered by the vertically moving means 63 so as to securely seal the vacuum chamber 51, a leak valve 64 is closed, and the chamber 51 is evacuated to a high vacuum by means of an evacuating system 61. At the same time, the drum type substrate 50 is heated with a heater 55 by switching on a power supply 55-1. After a suitable temperature is reached, the heated substrate 50 is transferred to the position right over a reaction chamber 57 by operating a rotating means 52 which is constructed with a motor and other parts. A gate valve 56 is opened, the heated substrate 50 is lowered by a vertically moving means 65 into the reaction chamber 57 and is set at a prescribed position therein. Then, the vertically moving means 65 moves upward to go out of the reaction chamber 57 into the vacuum chamber 51. Then, the gate valve 56 is closed. The film formation is carried out in the same manner as in the reaction chambers shown in FIG. 2. After completion of the film formation, the gate valve 56 is opened and the film-covered substrate is drawn up by the vertically moving means 65 into the vacuum chamber 51. Then, the substrate is transferred to a cooling position by operating the rotating means 52. After completion of the cooling, the leak valve 64 is opened and the cover 62 of the vacuum chamber 51 is opened by the vertically moving means 63. Then, the cooled film-covered substrate 50 is detached from the fixing means 53 and another new drum type substrate 50 is attached thereto. Then, the above-stated operations are repeated, whereby the same effects can be achieved as in the case with the apparatus shown in FIG. 2.

Also in the apparatus of FIG. 3, a plurality of reaction chambers for film formation can be installed. Effects of a plurality of reaction chambers in this case are similar to those in the case of the apparatus shown in FIG. 2.

Figure 5:
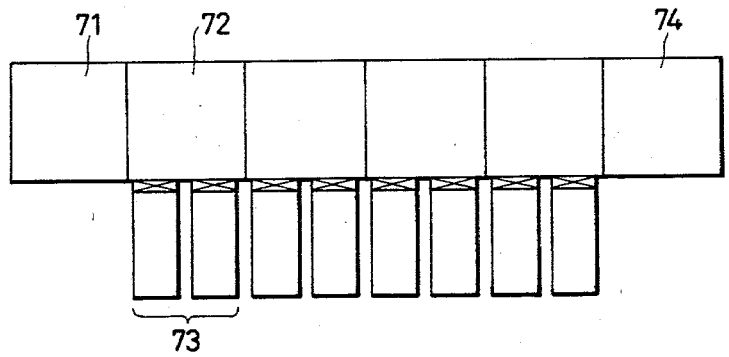

Another preferred embodiment of the apparatus of this invention has a number of serial units, as shown in FIG. 5, between a substrate charging chamber 71 and a finished-substrate discharging chamber 74, said units each comprising an interconnecting chamber 72 and a plurality of reaction chambers 73. Using such an apparatus, a multi-layered film can be formed on a substrate by introducing different raw material gases into the reaction chambers of the units respectively and treating the substrate in series with plasma environments of these gases.

Although this invention has been described referring to the formation of amorphous silicon films, other various kinds of films can also be formed by using various kinds of raw material gas; for example, SiC family films from $SiH_4$—$C_2H_4$ mixtures, Ge films from $GeH_4$, $Si_3N_4$ films from $SiH_4$—$NH_3$ mixtures, $SiO_2$ films from $SiH_4$—$O_2$ mixtures, and $Al_2O_3$ films from $AlCl_3$—$O_2$ mixtures. Further, films doped with a conductivity-governing impurity can be formed by using a raw material gas mixed with $PH_3$ or $B_2H_6$.

In the above illustrations, substrate transporting means have been shown merely as an example; other various substrate-transporting means generally employed may also be adopted.

Chief favorable effects of this invention are as follows:

(1) The vacuum heating operation, film forming operation, and cooling operation can be conducted in parallel; that is, during film formation on one substrate, the vacuum heating of the next substrate and the cooling of the preceding substrate are conducted.

(2) Substrates are free from the anxiety of contamination with the dust which may be produced in the reaction chambers, since the substrate charging chamber is separated from the reaction chambers.

(3) The reaction chambers are independently removable, and hence cleanable after every film forming operation, so that the film quality is stabilized.

(4) Since reaction chambers nearly the same in basic construction as conventional ones may be used, the apparatus is highly reliable.

(5) The reaction chambers are simple in structure and hence easy to clean.

What we claim is:

1. An apparatus for mass production of films by vacuum deposition which comprises a substrate charging stage which is capable of being evacuated, an interconnecting stage which is positioned adjacent to said substrate charging stage and is capable of being evacuated, a film-forming stage which is axially oriented with and removably attached to the interconnecting stage and is capable of being evacuated independently of the interconnecting stage and substrate transporting means for transporting the substrate for film formation charged in the substrate charging stage into the interconnecting stage by a horizontal movement and for transporting the substrate into the film forming stage by a vertical movement through an end of the interconnecting stage into an end of the film forming stage.

2. The apparatus of claim 1, wherein the film forming stage is composed of a plurality of reaction chambers.

3. The apparatus of claim 1, wherein a substrate discharging stage positioned adjacent to the interconnecting stage is further provided for taking out a complete-film supporting substrate.

4. The apparatus of claim 1, wherein the substrate charging stage is provided therein with a heating means for heating in advance a substrate on which a film is to be formed.

5. The apparatus of claim 3, wherein the substrate discharging stage has a structure capable of being evacuated.

6. The apparatus of claim 3, wherein the substrate discharging stage is provided therein with a cooling means for cooling a completed-film supporting substrate to a desired temperature.

7. The apparatus of claim 1, wherein the substrate charging stage and the interconnecting stage are positioned in a single vacuum chamber.

8. The apparatus of claim 1, wherein the substrate charging stage and the interconnecting stage can be independently evacuated.

9. The apparatus of claim 2, wherein a plurality of reaction chambers may be evacuated independently of one another.

10. The apparatus of claim 2, wherein a plurality of reaction chambers have a structure permitting independent film formations.

11. The apparatus of claim 2, wherein a plurality of reaction chambers are removably attached independently of one another to the interconnecting stage.

12. The apparatus of claim 1, which is provided with a plurality of units in parallel each comprising interconnecting stage and a film forming stage.

13. A process for mass producing of films by vacuum deposition which comprises the steps of:
 (1) setting a substrate for film supporting in a substrate charging stage which may be evacuated,
 (2) evacuating thereafter said substrate charging stage to a desired pressure, (3) transferring the substrate from the substrate charging stage to an interconnecting stage evacuated in advance to a desired pressure, (4) transferring said substrate from the interconnecting stage to a reaction chamber positioned in the vicinity of and under the interconnecting stage and evacuated in advance to a desired pressure, and setting the substrate in the reaction chamber, (5) introducing thereafter a film forming raw material gas into the reaction chamber, and keeping the reaction chamber at a desire pressure, (6) forming a plasma environment of the introduced raw material gas in the reaction chamber by an electric discharge, to deposit a film on the substrate, (7) returning the completed-film supporting substrate to the interconnecting stage; and (8) cooling and taking out the completed-film supporting substrate.

14. The process of claim 13, wherein evacuating step (2) further comprises heating the substrate.

15. The process of claim 13, further comprising a step for heating the substrate provided after evacuating step (2) and prior to transferring step (3).

16. The process of claim 13, wherein gas introducing step (5) further comprises heating the substrate positioned in the reaction chamber.

17. The process of claim 13, further comprising a step for transporting the returned substrate to a discharge chamber provided after returning step (7) and prior to cooling step (8).

18. The apparatus of claim 1, further comprising a gate-valve provided between the substrate charging stage and the interconnecting stage.

19. The apparatus of claim 1, further comprising a gate-valve provided between the interconnecting stage and the film forming stage.

20. The apparatus of claim 1, wherein the film forming stage further comprises a means for rotating the substrate.

21. The apparatus of claim 1, wherein each of the substrate charging stage, the interconnecting stage and the film forming stage further comprises an evacuating means, said evacuating means being independently operable.

22. The apparatus of claim 1, further comprising means for heating the film forming substrate.

23. The apparatus of claim 1, wherein each of the substrate charging stage and the film forming stage further comprises a means for heating the film forming substrate.

* * * * *

UNITED STATES PATENT AND TRADEMARK OFFICE
CERTIFICATE OF CORRECTION

PATENT NO. : 4,666,734

DATED : May 19, 1987

INVENTOR(S) : OSAMU KAMIYA, ET AL.

Page 1 of 2

It is certified that error appears in the above-identified patent and that said Letters Patent is hereby corrected as shown below:

AT [75] IN THE INVENTORS

Line 4,    "Sakorashimachi," should read --Sakurashinmachi,--.

COLUMN 1

Line 10,   "before the footlights" should read --in the spotlight--.
    Line 61,   "electrode to" should read --electrode 2 to--.

COLUMN 2

Line 9,    "for" should be deleted.
    Line 39,   "above noted" should read --above-noted--.
    Line 50,   "provide" should read --provides--.

COLUMN 3

Line 15,   "OF PREFERRED" should read --OF THE PREFERRED--.

COLUMN 4

Line 9,    "means the" should read --means of the--.
    Line 34,   "above stated" should read --above-stated--.

COLUMN 6

Line 61,   "comprising intercon-" should read --comprising an intercon- --.

UNITED STATES PATENT AND TRADEMARK OFFICE
CERTIFICATE OF CORRECTION

PATENT NO. : 4,666,734

DATED : May 19, 1987

INVENTOR(S) : OSAMU KAMIYA, ET AL.

It is certified that error appears in the above-identified patent and that said Letters Patent is hereby corrected as shown below:

COLUMN 7

Line 12, "desire" should read --desired--.

Signed and Sealed this

Twenty-ninth Day of September, 1987

Attest:

DONALD J. QUIGG

Attesting Officer     Commissioner of Patents and Trademarks